United States Patent
Zhang et al.

(10) Patent No.: US 7,760,040 B2
(45) Date of Patent: Jul. 20, 2010

(54) METHOD OF ELIMINATING TEMPERATURE INDUCED BAND SWITCHING IN ULTRA WIDEBAND VOLTAGE CONTROLLED OSCILLATOR

(75) Inventors: Liping Zhang, Torrance, CA (US); Ray Herman, Pls. Vrds. Est., CA (US); Sanjai Kohli, Torrance, CA (US); Neng-Tze Yang, Hermosa Beach, CA (US)

(73) Assignee: SiRF Technology, Inc., San Jose, CA (US)

( * ) Notice: Subject to any disclaimer, the term of this patent is extended or adjusted under 35 U.S.C. 154(b) by 454 days.

(21) Appl. No.: 11/625,210

(22) Filed: Jan. 19, 2007

(65) Prior Publication Data

US 2008/0197933 A1 Aug. 21, 2008

Related U.S. Application Data

(60) Provisional application No. 60/760,716, filed on Jan. 20, 2006.

(51) Int. Cl.
 *H03B 5/12* (2006.01)
(52) U.S. Cl. .................................... 331/179; 331/185
(58) Field of Classification Search ................. 331/179, 331/44, 17; 327/157
 See application file for complete search history.

(56) References Cited

U.S. PATENT DOCUMENTS

| | | | |
|---|---|---|---|
| 4,083,015 A | 4/1978 | Popodi | |
| 5,343,170 A | 8/1994 | Lee | |
| 6,208,215 B1 | 3/2001 | Sauer | |
| 6,838,947 B2 * | 1/2005 | Gomez | 331/17 |
| 6,864,723 B2 | 3/2005 | Choi | |
| 6,972,625 B2 | 12/2005 | Nguyen et al. | |

OTHER PUBLICATIONS

PCT International Search Report, Feb. 14, 2008.

* cited by examiner

*Primary Examiner*—Joseph Chang
(74) *Attorney, Agent, or Firm*—Thomas, Kayden, Horstemeyer & Risley, LLP

(57) ABSTRACT

A method and a voltage-controlled oscillator provide an output signal with a frequency within one of a plurality of frequency bands, while reducing or eliminating temperature-induced band-switching or other drifts in operating frequency. The band-switching is reduced or eliminated by providing a circuit that adjusts a tuning sensitivity according to a calibration performed under test conditions. For example, such a voltage-controlled oscillator may include (a) a digitally controlled variable current source for providing a first control current to select one of the frequency bands for the voltage-controlled oscillator; (b) a variable transconductance circuit providing a second control current to compensate a variation in operating frequency; and (c) a control circuit for varying the frequency of the output signal in accordance with the first and second control signals. The variable transconductance circuit may be programmable by selectively activating elements of an array of varactor circuits, according to a capacitance associated with each varactor circuit. The capacitance associated with each varactor circuit is binary weighted.

24 Claims, 6 Drawing Sheets

METHOD OF ELIMINATING TEMPERATURE INDUCED BAND SWITCHING IN ULTRA WIDEBAND VOLTAGE CONTROLLED OSCILLATOR

CROSS REFERENCE TO RELATED APPLICATIONS

The present invention is related to and claims priority of U.S. Provisional Patent Application, entitled "Method of Eliminating Temperature Induced Band Switching In Ultra Wideband Voltage Controlled Oscillator," Ser. No. 60/760,716, which was filed on Jan. 20, 2006. The disclosure of this U.S. provisional patent application is hereby incorporated by reference in its entirety.

BACKGROUND OF THE INVENTION

1. Field of the Invention

The present invention relates to a method for eliminating temperature-induced band switching in a ultra-wide band (UWB) voltage controlled oscillator (VCO).

2. Discussion of the Related Art

A phase-locked loop (PLL) is a common component in a communication system. In a typical PLL, a voltage-controlled oscillator (VCO) provides a signal which frequency varies according to a control signal applied at the VCO's input terminal. Conventionally, for a wideband VCO, spurs are reduced by dividing the entire frequency range into smaller bands. This approach can lead to problems. For example, as a result of such frequency divisions, only narrow frequencies are covered within each band. When the temperature changes, band-switching may be necessary for the PLL to remain tuned to the same frequency. In a video receiver, band-switching in the PLL may induce significant flickering in the received signal. In the prior art, spurs are reduced by decreasing the tuning sensitivity $K_{VCO}$ of the VCO However, decreasing $K_{VCO}$ also tends to result in band switching-induced screen flickering.

SUMMARY

According to one embodiment of the present invention, a method and a voltage-controlled oscillator provide an output signal with a frequency within one of a plurality of frequency bands, while reducing or eliminating temperature-induced band-switching or other drifts in operating frequency. In one embodiment, the band-switching is reduced or eliminated by providing a circuit that adjusts a tuning sensitivity according to a calibration performed under test conditions.

According to one embodiment of the present invention, a voltage-controlled oscillator includes (a) a digitally controlled variable current source for providing a first control current to select one of the frequency bands for the voltage-controlled oscillator; (b) a variable transconductance circuit providing a second control current to compensate a variation in operating frequency; and (c) a control circuit for varying the frequency of the output signal in accordance with the first and second control signals. The variable transconductance circuit may be programmable by selectively activating elements of an array of varactor circuits, according to a capacitance associated with each varactor circuit. The capacitance associated with each varactor circuit is binary weighted.

According to one embodiment of the present invention, the variable current source may include a capacitor switch array, and the varactor circuits in the variable transconductance are each matched in its associated capacitance with one or more corresponding elements of the capacitor switch array. A bias voltage, which may be a differential signal, is provided to each varactor circuits during operation.

In one embodiment of the present invention, the variable transconductance circuit is programmable in discrete steps each corresponding to a predetermined tuning sensitivity.

The present invention is better understood upon consideration of the detailed description below in conjunction with the drawings.

DETAILED DESCRIPTION

The present invention provides methods and circuits that reduce or eliminate temperature-induced band-switching in an ultra-wide band (UWB) voltage-controlled oscillator (VCO). The present invention avoids screen flickering induced by VCO frequency band switching due to temperature variations in wireless video receivers. Reference spurs and power supply ripple spurs are also reduced, enabling the receiver to operate in less than ideal environments, ensuring synthesizer loop stability and, thus, increase production yields over process, temperature and voltage variations.

Various embodiments of the present invention are able to eliminate frequency band switching issues for temperature varying between approximately −40° F. to 100° F., regardless of the initial condition, over all process corners and voltage variations, after calibrating the minimum frequency variation over entire temperature range. More generally, the present invention provides a VCO with a configurable tuning sensitivity $K_{VCO}$ that is relatively constant over process corners, so as to limit any temperature-induced frequency variation or "walk" to within a selected frequency band. Stated differently, the programmable $K_{VCO}$ accommodates temperature-induced frequency variation within each frequency band of the VCO, thereby obviating band switching. The $K_{VCO}$ is calibrated for each integrated circuit before normal operation. The calibration results are used to configure the $K_{VCO}$ to conform to the process corner.

Figure 1:
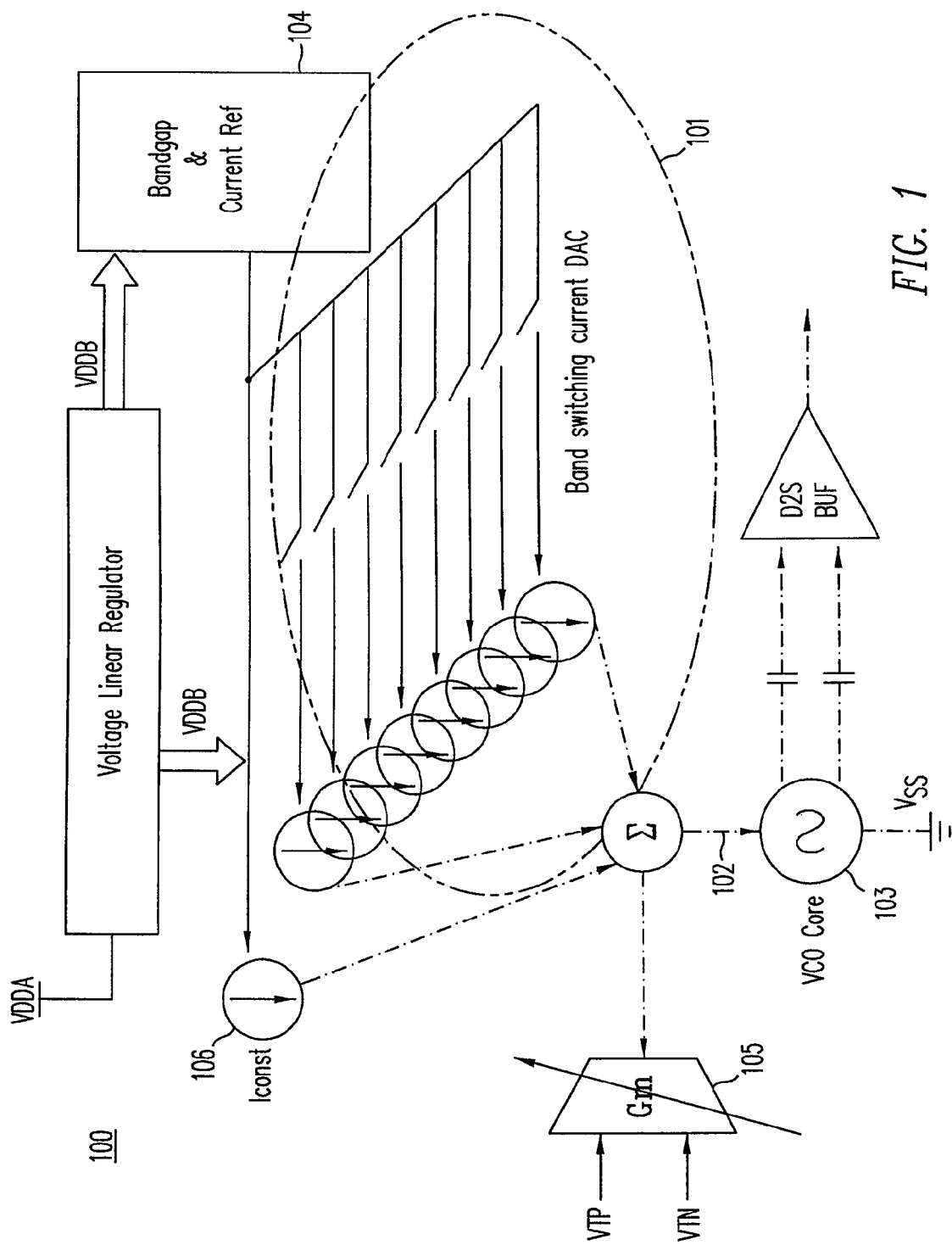
FIG. 1 shows ring oscillator circuit 100 which provides an adaptive tuning sensitivity $K_{VCO}$, in accordance with one embodiment of the present invention.

Referring now to FIG. 1, ring oscillator 100 is current-controlled—i.e., its output signal frequency is proportional to current 102 into VCO core 103, up to a limiting value. Bandgap and current reference circuit 104 provides common bias voltages to generate known currents in ring oscillator 100. Constant current source 106 generates initial current $I_{CONST}$ necessary to start and maintain oscillation in VCO core 103 at a desired frequency range. Current-switching digital/analog converter (DAC) determines the frequency band of operation based on its input code word. Based on the input code word, current-switching DAC 101 provides a variable current that is summed with current $I_{CONST}$ from constant current source 106 to select the frequency band of operation. Gm block 105 generates a configurable transconductance, which provides the programmable $K_{VCO}$.

The transconductance of Gm block 105 is designed to be highly linear—i.e., its output current is a linear function of the differential input voltage (VTP-VTN). The total current sunk by the VCO core 103 (i.e., the sum of currents provided or drawn by constant current source 106, current-switching DAC 101 and Gm block 105) together with the RC delay or negative transconductance in VCO 103 determines the frequency of oscillation.

Figure 2:
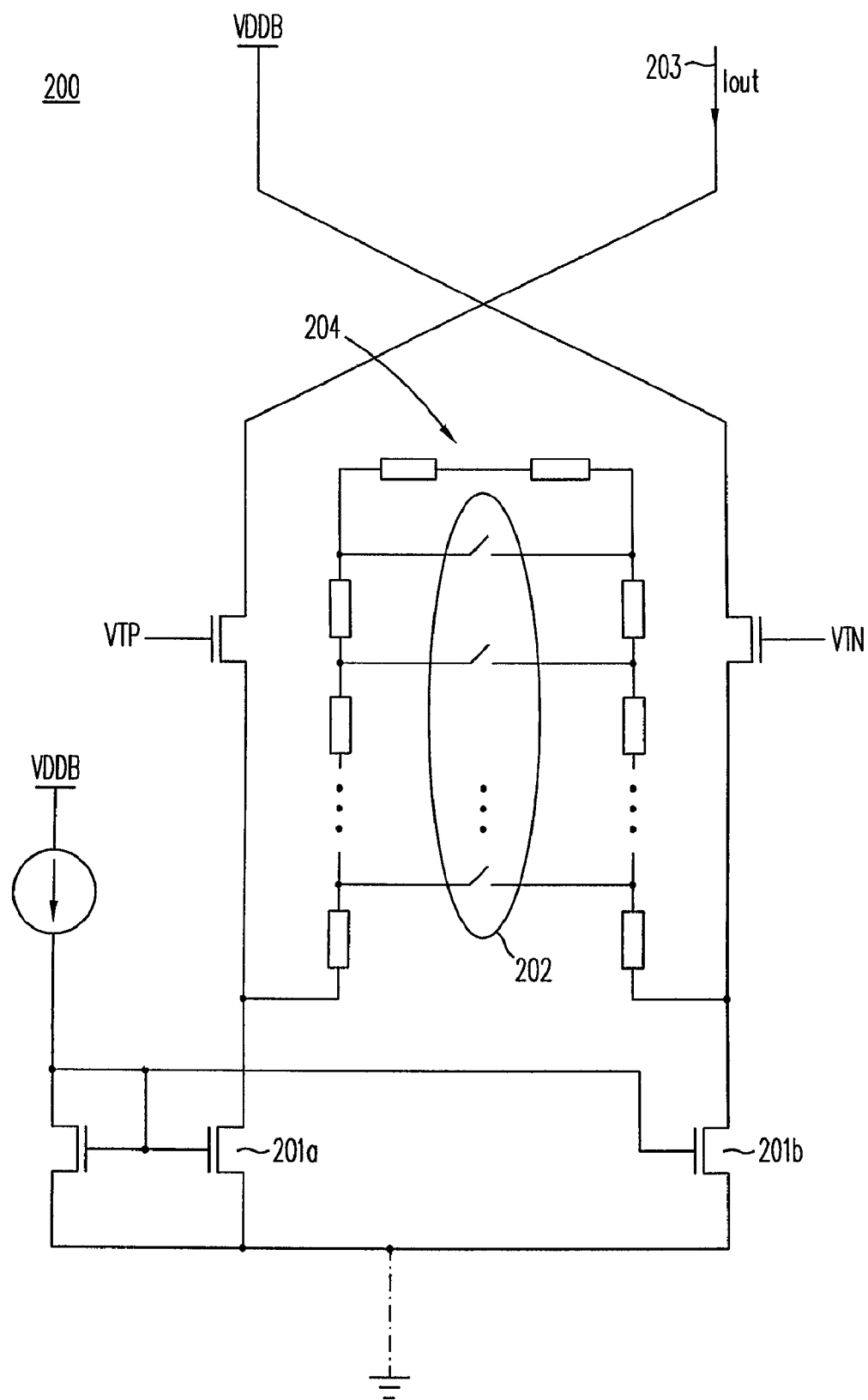
FIG. 2 shows circuit 200 including a current-mode configurable trans-conductance circuit which provides a configurable tuning sensitivity $K_{VCO}$, in accordance with a further embodiment of the present invention.

FIG. 2 shows exemplary circuit 200 for realizing Gm block 105 of FIG. 1. As shown in FIG. 2, the current change in terminal 203 is a linear function of the differential tuning voltage (VTP-VTN) is discretely determined by resistor bank 204 via switch array 202, which may be either binary controlled or thermometer controlled. During calibration, if the calibrated tuning sensitivity $K_{VCO}$ is found lower than the required value for maintaining ring oscillator 100 in the selected frequency band (i.e., requiring no band-switching), the digital control word for controlling switch array 202 is selected in such a way that the equivalent resistance decreases, so that $K_{VCO}$ increases to achieve the minimum frequency range for the selected frequency band. Conversely, if the calibrated $K_{VCO}$ exceeds the required value, then the digital control word is selected to lower $K_{VCO}$, so as to reduce the spurs that appear at the output of VCO core 103. (The reference spur, fractional spur and power ripple spur are all proportional to the value of the $K_{VCO}$).

Figure 3A:
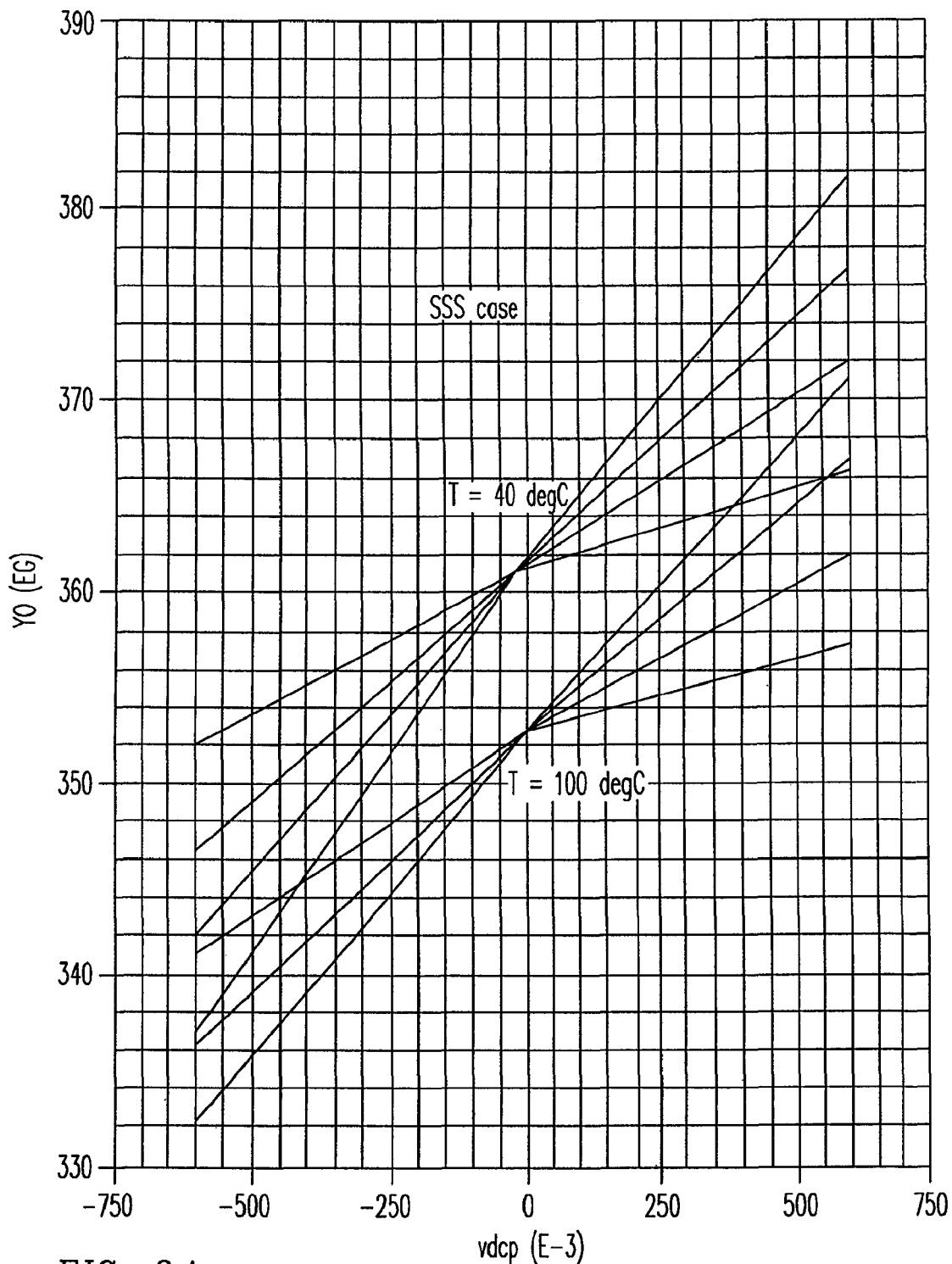
FIG. 3 shows the frequency variation over tuning voltage variation for four selected $K_{VCO}$ (in MHz/V) values, at each of temperatures −40° C. and 100° C., respectively.
Figure 3B:
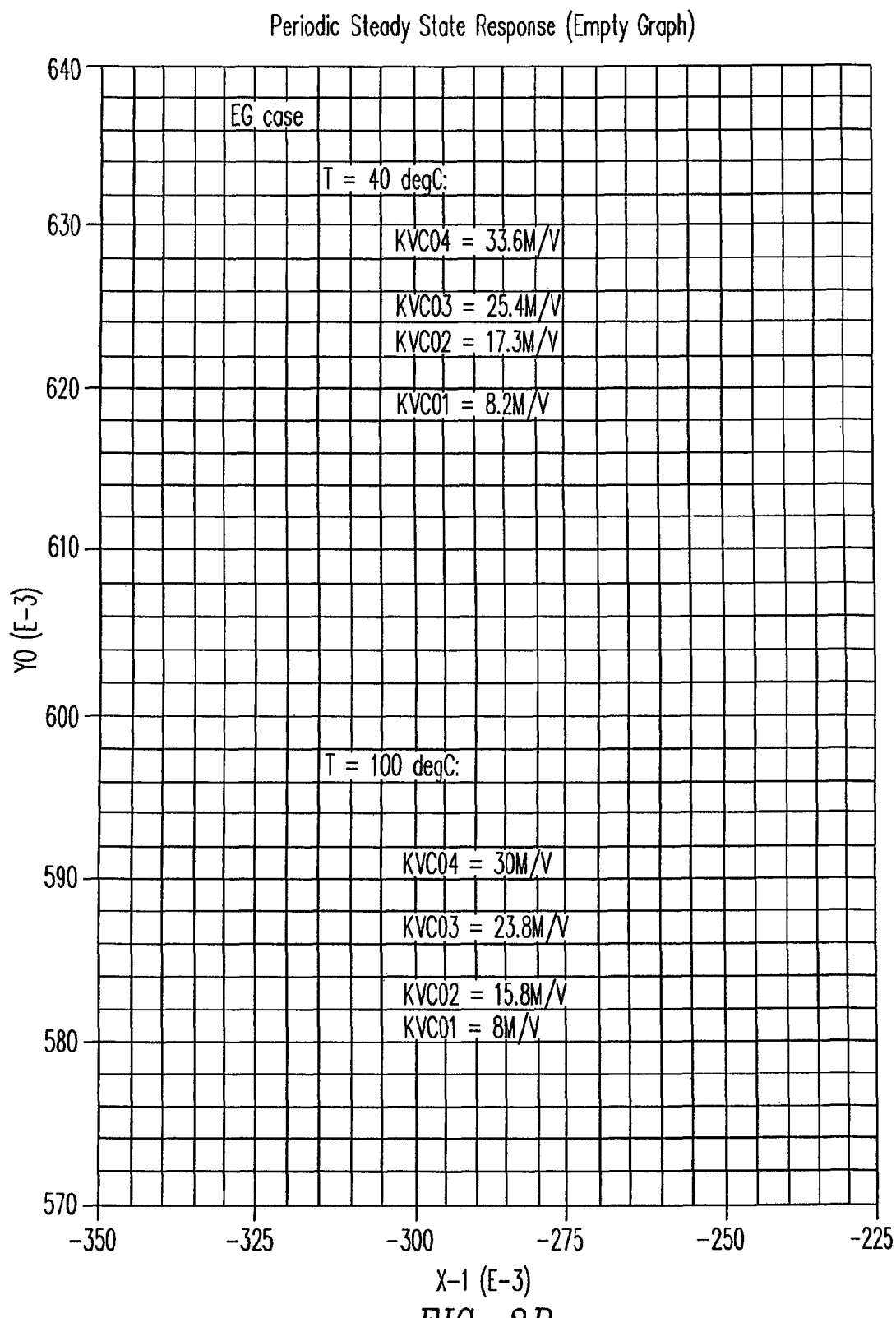

The degree of configurability of $K_{VCO}$ is determined by the number of bits used and the total variable current. FIG. 3 shows the frequency variation over tuning voltage variation for four selected $K_{VCO}$ (in MHz/V) values, at each of temperatures −40° C. and 100° C., respectively. Thus, FIG. 3 may be used to implement a configurable 4-step $K_{VCO}$ at each temperature condition.

Figure 4:
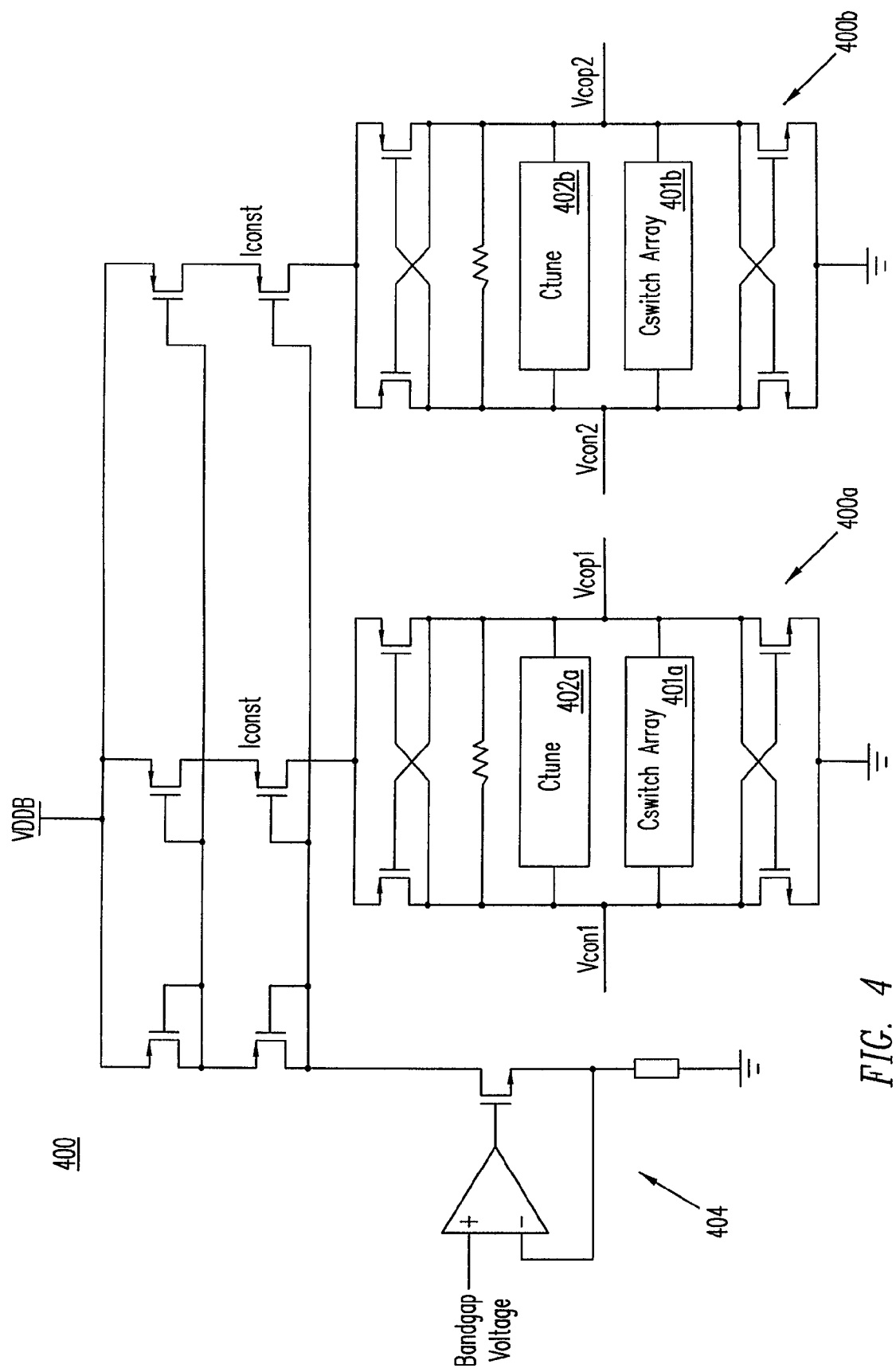
FIG. 4 shows two ultra-wide band LC-VCO circuits 400a and 400b with a regulated current generator 404, in which a band switch network is realized in the $C_{switch}$ array block 401a or 401b and a configurable $K_{VCO}$ circuit is realized in the $C_{tune}$ block 402a or 402b.
Figure 5:
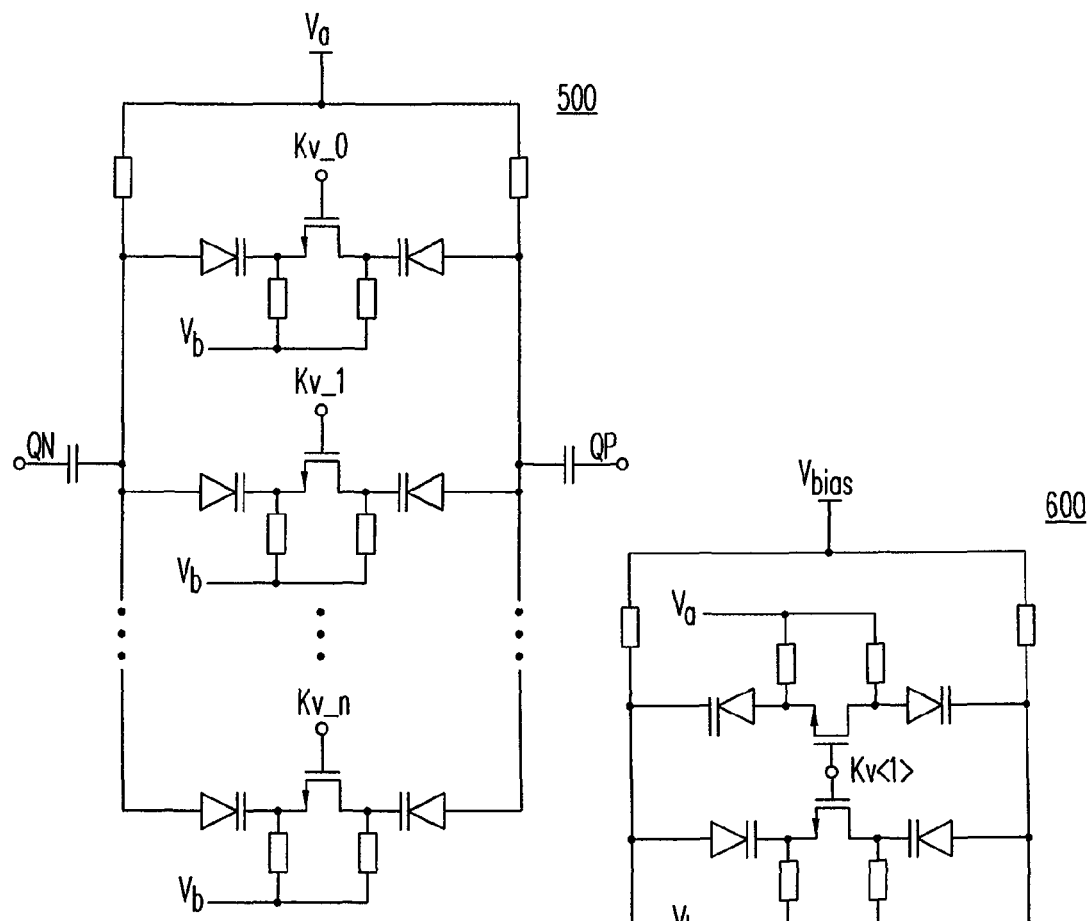
FIG. 5 shows an implementation 500 of an ultra-wide band LC-VCO circuit.
Figure 6:
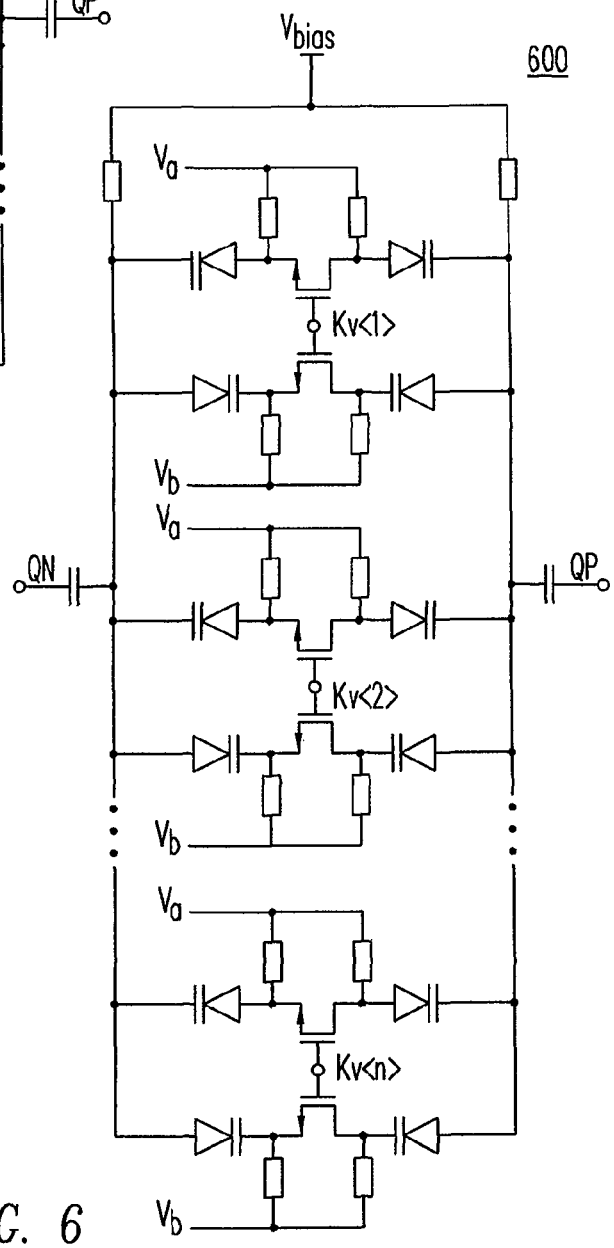
FIG. 6 shows an alternative implementation 600 of an ultra-wide band LC-VCO circuit.

FIG. 4 shows two ultra-wide band LC-VCO circuits 400a and 400b with a regulated current generator 404, in which a band switch network is realized in the $C_{switch}$ array block 401a or 401b and a configurable $K_{VCO}$ circuit is realized in the $C_{tune}$ block 402a or 402b. FIGS. 5 and 6 show, respectively, implementations of ultra-wide band LC-VCO circuits that include a band switch network and a configurable $K_{VCO}$. The tunable frequency range as a function of voltage variation (i.e., $K_{VCO}$) is configured by switching the binary varactor sizes (e.g., if N different varactor sizes are available: varactor$_1$, varactor$_2$, varactor$_3$, . . . , varactor$_N$) under an applied differential voltage ($V_a$-$V_b$). The complementary bits control corresponding capacitors cap$_1$, cap$_2$, . . . , cap$_N$ in the capacitor array, with each capacitor having the same capacitance as the corresponding varactor when the tuning voltage is zero. Accordingly, the center frequency of oscillation stays the same while $K_{VCO}$ varies, thereby obviating a need for recalibration for the frequency band selection. The $C_{switch}$ array block 500 of FIG. 5 is used for frequency band-switching and covers the ultra-wide frequency range.

FIG. 6 illustrates realizing a configurable $K_{VCO}$ in a fully differential PLL, where two pair varactors of the reverse polarities are switched on and off, under control by a common digital control bit. The size of each varactor is binary weighted to realize maximum configurability with the shortest digital word. The total capacitance is compensated to maintain the same value without band-switching.

Thus, methods and apparatus for reducing or eliminating temperature induced band switching in ultra-wide band (UWB) voltage controlled oscillators (VCOs).

The above detailed description is provided to illustrate the specific embodiments of the present invention and is not intended to be limiting. Numerous modifications and variations within the scope of the present invention are possible. The present invention is set forth in the following claims.

We claim:

1. A voltage-controlled oscillator for providing an output signal with a frequency within one of a plurality of frequency bands, comprising:
    a digitally controlled variable current source for providing a first control current to select one of the frequency bands for the voltage-controlled oscillator;
    a variable transconductance circuit providing a second control current to compensate a variation in operating frequency; and
    a control circuit for varying the frequency of the output signal in accordance with the first and second control signals.

2. A voltage-controlled oscillator as in claim 1, wherein the variation in operating frequency is temperature induced.

3. A voltage-controlled oscillator as in claim 1, wherein the variable transconductance circuit is programmable according to a calibration under test conditions.

4. A voltage-controlled oscillator as in claim 1, wherein the variable current source comprises a digital-to-analog converter.

5. A voltage-controlled oscillator as in claim 1, wherein the variable current source comprises a switch array.

6. A voltage-controlled oscillator as in claim 1, wherein the variable transconductance circuit comprises an array of varactor circuits.

7. A voltage-controlled oscillator as in claim 6, wherein the transconductance circuit is programmed by selectively enabling the varactor circuits according to a capacitance associated with each varactor circuit.

8. A voltage-controlled oscillator as in claim 7, wherein the capacitance associated with each varactor circuit is binary weighted.

9. A voltage-controlled oscillator as in claim 7, wherein the variable current source comprises a capacitor switch array, wherein the varactor circuits in the variable transconductance are each matched in its associated capacitance with one or more corresponding elements of the capacitor switch array.

10. A voltage-controlled oscillator as in claim 1, wherein a bias voltage is provided to each varactor circuits during operation.

11. A voltage-controlled oscillator as in claim 10, wherein the bias voltage is a differential signal.

12. A voltage-controlled oscillator as in claim 1, wherein the variable transconductance circuit is programmable in discrete steps each corresponding to a predetermined tuning sensitivity.

13. In a voltage-controlled oscillator, a method for providing an output signal with a frequency within one of a plurality of frequency bands, comprising:
    programming a variable transconductance circuit to adjust tuning sensitivity according to a calibration performed prior to normal operation, wherein the tuning sensitivity conforms to process corners;
    digitally controlling a variable current source to provide a first control current to select one of the frequency bands for the voltage-controlled oscillator;

using the variable transconductance circuit, providing a second control current to compensate a variation in operating frequency; and a control circuit for varying the frequency of the output signal.

14. A method as in claim 13, wherein the variation in operating frequency is temperature induced.

15. A method as in claim 13, further comprising providing in the variable current source a digital-to-analog converter.

16. A method as in claim 13, further comprising providing in the variable current source a switch array.

17. A method as in claim 13, wherein the variable transconductance circuit comprises an array of varactor circuits.

18. A method as in claim 17, further comprising programming the transconductance circuit by selectively enabling the varactor circuits according to a capacitance associated with each varactor circuit.

19. A method as in claim 18, wherein the capacitance associated with each varactor circuit is binary weighted.

20. A method as in claim 18, wherein the variable current source comprises a capacitor switch array, wherein the varactor circuits in the variable transconductance are each matched in its associated capacitance with one or more corresponding elements of the capacitor switch array.

21. A method as in claim 18, further comprising providing a bias voltage to each varactor circuits during operation.

22. A method as in claim 21, wherein the bias voltage is a differential signal.

23. A method as in claim 13, wherein the variable transconductance circuit is programmable in discrete steps each corresponding to a predetermined tuning sensitivity.

24. A voltage-controlled oscillator for providing an output signal with a frequency within one of a plurality of frequency bands, comprising:

a digitally controlled variable current source configured to provide a first control current to select one of the frequency bands for the voltage-controlled oscillator;

a variable transconductance circuit configured to provide a second control current to compensate for variation in operating frequency, wherein the variable transconductance circuit has a configurable tuning sensitivity level calibrated prior to normal operation, and wherein the variable transconductance circuit comprises a switch array for controlling a differential tuning voltage; and a control circuit for varying the frequency of the output signal in accordance with the first and second control signals.

* * * * *